(12) United States Patent
Chen

(10) Patent No.: US 12,348,230 B2
(45) Date of Patent: Jul. 1, 2025

(54) ALL-DIGITAL DUTY CYCLE CORRECTOR AND METHOD FOR CORRECTING DUTY CYCLE OF OUTPUT CLOCK

(71) Applicant: Realtek Semiconductor Corp., HsinChu (TW)

(72) Inventor: Tse-Hung Chen, HsinChu (TW)

(73) Assignee: Realtek Semiconductor Corp., HsinChu (TW)

( * ) Notice: Subject to any disclaimer, the term of this patent is extended or adjusted under 35 U.S.C. 154(b) by 114 days.

(21) Appl. No.: 18/236,404

(22) Filed: Aug. 22, 2023

(65) Prior Publication Data

US 2024/0120910 A1 Apr. 11, 2024

(30) Foreign Application Priority Data

Oct. 5, 2022 (TW) .................................. 111137792

(51) Int. Cl.
*H03K 5/156* (2006.01)
(52) U.S. Cl.
CPC .................................. *H03K 5/1565* (2013.01)
(58) Field of Classification Search
None
See application file for complete search history.

(56) References Cited

U.S. PATENT DOCUMENTS

| | | | |
|---|---|---|---|
| 4,479,216 A | 10/1984 | Krambeck | |
| 8,923,462 B2 * | 12/2014 | Choi | H04L 25/4902 327/175 |
| 9,236,853 B2 * | 1/2016 | Walker | H03K 5/05 |
| 9,998,125 B2 * | 6/2018 | Balamurugan | H03L 7/00 |
| 11,070,200 B2 | 7/2021 | Martin | |

OTHER PUBLICATIONS

Hwang-Cherng Chow, "Duty Cycle Adjusting Circuit for Clock Signals", WSEAS, USA, 2005.
Gijin Park, Jaeduk Han, Woorham Bae, "Design and Analysis of Asynchronous Sampling Duty Cycle Corrector", MDPI, USA, 2021.

* cited by examiner

*Primary Examiner* — Cassandra F Cox
(74) *Attorney, Agent, or Firm* — Winston Hsu

(57) ABSTRACT

An all-digital duty cycle corrector and a method for correcting a duty cycle of an output clock are provided. The all-digital duty cycle corrector includes a duty cycle adjustment circuit, an asynchronous sampler, a counter and a correction control circuit. The duty cycle adjustment circuit performs duty cycle adjustment on an input clock to generate the output clock according to a digital control code. The asynchronous sampler performs asynchronous sampling on the output clock to generate N sampling results at N time points, respectively. The counter counts a number of first logic values among the N sampling results to generate a counting result. The correction control circuit compares the counting result with a reference value to generate a comparison result, and selectively adjusts the digital control code according to the comparison result, in order to correct the duty cycle of the output clock.

16 Claims, 4 Drawing Sheets

ALL-DIGITAL DUTY CYCLE CORRECTOR AND METHOD FOR CORRECTING DUTY CYCLE OF OUTPUT CLOCK

BACKGROUND OF THE INVENTION

1. Field of the Invention

The present invention is related to duty cycle correction, and more particularly, to an all-digital duty cycle corrector and a method for correcting a duty cycle of an output clock.

2. Description of the Prior Art

When an analog duty cycle corrector is utilized for correcting a duty cycle of an output clock, the analog duty cycle corrector typically utilizes a resistor-capacitor (RC) low pass filter therein to perform low pass filtering on the output clock. As a 3-decibel bandwidth of the RC low pass filter is typically much lower than a frequency of the output clock, the RC low pass filter is able to achieve an effect of voltage averaging on the output clock in order to generate an averaged voltage. The analog duty cycle corrector may also utilize an operational amplifier to receive the averaged voltage and a reference voltage, and accordingly generate a control voltage to control the duty cycle of the output clock, thereby forming a loop operation. When this loop operation reaches a locked state, the averaged voltage may converge to a voltage level that is the same as the reference voltage, and the duty cycle of the output clock may be corrected to a target ratio.

Under a condition where the semiconductor process is improved such that a voltage level of a supply voltage gets lower, the architecture mentioned above may face some bottlenecks, making the purpose of correcting the duty cycle hard to achieve. For example, voltage headroom of the operational amplifier may be suppressed, which makes transistors within the operational amplifier more likely to enter a linear region, resulting in a failure to achieve loop locking. In addition, the analog duty cycle corrector mentioned above comprises various analog signal control circuits. In order to meet performance requirements such as gain, component matching and bandwidth, these analog signal control circuits must occupy a certain area, which goes against an objective in the field to reduce a circuit area of the semiconductor.

Thus, there is a need for a novel architecture and method that can solve the above-mentioned problems of a semiconductor implementation using analog circuits.

SUMMARY OF THE INVENTION

An objective of the present invention is to provide an all-digital duty cycle corrector and a method for correcting a duty cycle of an output clock, in order to implement correction of the duty cycle with all-digital circuits and control.

At least one embodiment of the present invention provides an all-digital duty cycle corrector. The all-digital duty cycle corrector comprises a duty cycle adjustment circuit, an asynchronous sampler, a counter and a correction control circuit. The duty cycle adjustment circuit is configured to perform duty cycle adjustment on an input clock to generate an output clock according to a digital control code. The asynchronous sampler is configured to perform asynchronous sampling on the output clock to generate N sampling results at N time points, respectively. The counter is configured to count a number of first logic values among the N sampling results to generate a counting result. The correction control circuit is configured to compare the counting result with a reference value to generate a comparison result, and selectively adjust the digital control code according to the comparison result, in order to correct a duty cycle of the output clock.

At least one embodiment of the present invention provides a method for correcting a duty cycle of an output clock, wherein the method is applicable to an all-digital duty cycle corrector, and the method comprises: utilizing a duty cycle adjustment circuit of the all-digital duty cycle corrector to perform duty cycle adjustment on an input clock to generate the output clock according to a digital control code; utilizing an asynchronous sampler of the all-digital duty cycle corrector to perform asynchronous sampling on the output clock to generate N sampling results at N time points, respectively; utilizing a counter of the all-digital duty cycle corrector to count a number of first logic values among the N sampling results to generate a counting result; and utilizing a correction control circuit of the all-digital duty cycle corrector to compare the counting result with a reference value to generate a comparison result, and selectively adjust the digital control code according to the comparison result, in order to correct the duty cycle of the output clock.

The all-digital duty cycle corrector and the associated method provided by embodiments of the present invention perform the asynchronous sampling on the output clock, in order to utilize a digital detection manner to determine whether the duty cycle of the output clock is too high or too low, and perform corresponding adjustments. As the embodiments of the present invention can be implemented with an all-digital circuit, an overall circuit area can be reduced. Thus, the embodiments of the present invention do not require analog circuits such as operational amplifiers, and the problems of the related art can be effectively solved.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
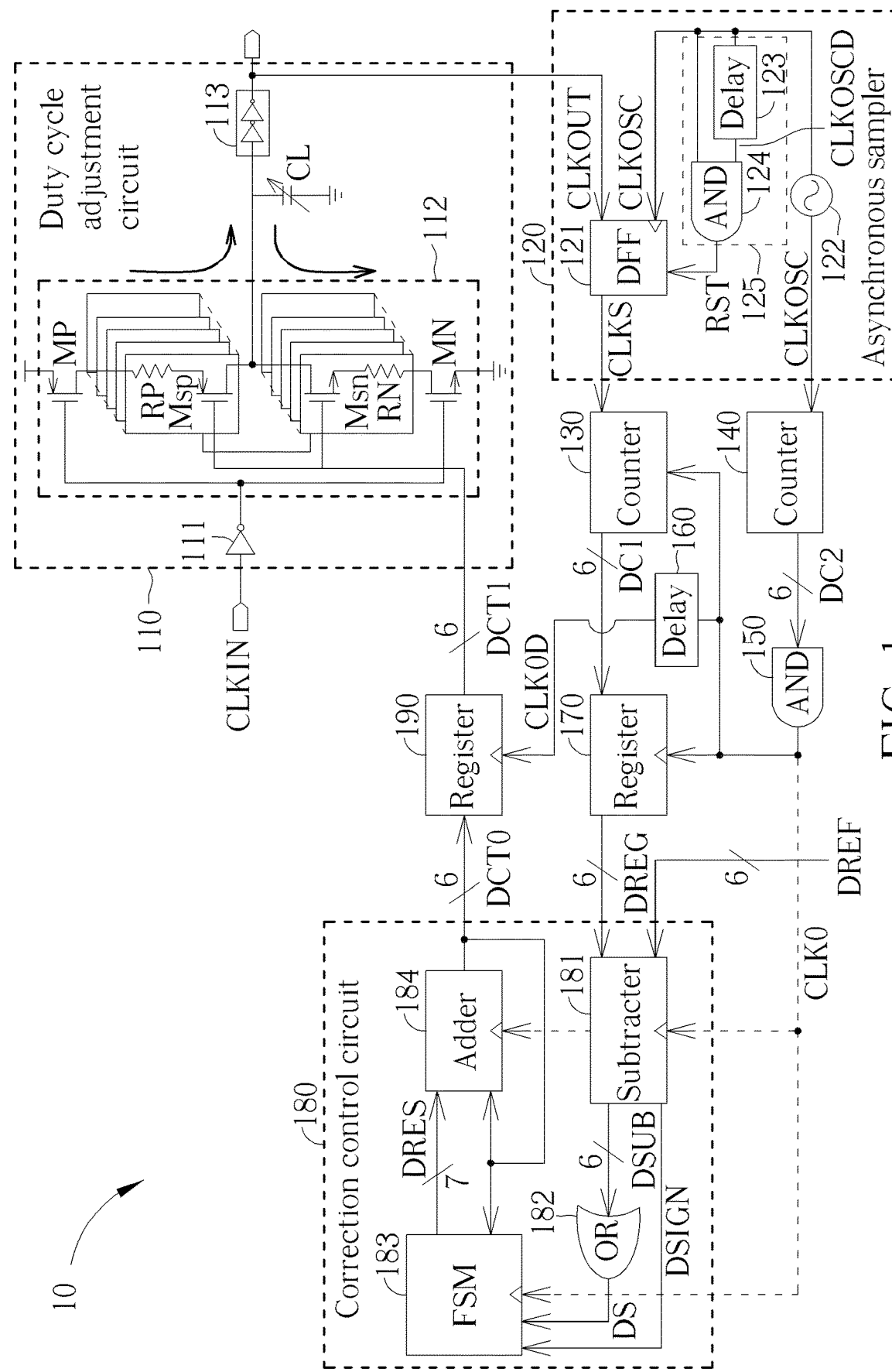
FIG. 1 is a diagram illustrating an all-digital duty cycle corrector according to an embodiment of the present invention.

FIG. 1 is a diagram illustrating an all-digital duty cycle corrector 10 according to an embodiment of the present invention. As shown in FIG. 1, the all-digital duty cycle corrector 10 comprises a duty cycle adjustment circuit 110, an asynchronous sampler 120, counters 130 and 140, an AND logic gate 150 (labeled "AND" in FIG. 1 for brevity), a delay circuit 160 (labeled "Delay" in FIG. 1 for brevity), a register 170, a correction control circuit 180 and a register 190. The asynchronous sampler 120 is coupled to the duty cycle adjustment circuit 110. Both of the counters 130 and 140 are coupled to the asynchronous sampler 120. The AND logic gate 150 is coupled between the counter 140 and the correction control circuit 180. The delay circuit 160 is coupled between the AND logic gate 150 and the register 190. The register 170 is coupled between the counter 130 and the correction control circuit 180. The register 190 is coupled between the duty cycle adjustment circuit 110 and the correction control circuit 180.

In this embodiment, the duty cycle adjustment circuit 110 receives a digital control code DCT1 (e.g. a digital control code represented by a 6-bit digital signal) from the register 190, to perform duty cycle adjustment on an input clock CLKIN to generate an output clock CLKOUT according to the digital control code DCT1. The asynchronous sampler 120 receives the output clock CLKOUT from the duty cycle adjustment circuit 110, and performs asynchronous sampling on the output clock CLKOUT according to an asynchronous clock CLKOSC to generate a sampled clock CLKS, where the sampled clock CLKS carries N sampling results respectively generated at N time points, and N is a positive integer. The counter 130 receives the sampled clock CLKS from the asynchronous sampler 120, and counts a number of first logic values among the N sampling results to generate a counting result DC1 (e.g. a counting result represented by a 6-bit digital signal). For example, the N sampling results may comprise multiple first logic values (e.g. logic values "1") and multiple second logic value (e.g. logic values "0"), where a ratio between the number of the first logic values among the N sampling results and a number of the second logic values among the N sampling results may indicate a duty cycle of the output clock CLKOUT. Thus, the following operations may determine whether the duty cycle of the output clock CLLOUT is too high or too low according to the counting result DC1. In addition, the counter 140 counts a cycle number of the asynchronous clock CLKOSC to generate a counting result DC2 (e.g. a counting result represented by a 6-bit digital signal). Thus, the counting result DC2 may indicate a number of sampling results obtained by the asynchronous sampler 120 performing the asynchronous sampling on the output clock CLKOUT. In this embodiment, when all 6 bits of the counting result DC2 are logic values "1", it means the number of sampling results obtained by the asynchronous sampler 120 performing the asynchronous sampling on the output clock CLKOUT reaches a predetermined number (e.g. 64 or 63). The AND logic gate 150 may accordingly pull a control clock CLK0 to the logic value "1", in order to trigger the register 170 to store the counting result DC1 at this moment as a counting result DREG (e.g. a counting result represented by a 6-bit digital signal) which is transmitted to the digital control circuit 180. When the control clock CLK0 is pulled to the logic value "1", the correction control circuit 180 is triggered to compare the counting result DREG and a reference value DREF (e.g. a reference value represented by a 6-bit digital signal) to generate a comparison result, and selectively adjust the digital control code DCT1 according to the comparison result, in order to correct the duty cycle of the output clock CLKOUT. More particularly, the correction control circuit 180 may selectively adjust a digital control code DCT0 (e.g. a digital control code represented by a 6-bit digital signal) to be transmitted to the register 190 according to the comparison result, and the register 190 may store the digital control code DCT0 as the digital control code DCT1 according to timing of a delayed control clock CLK0D. In this embodiment, as the operation of the correction control circuit 180 updating the digital control code DCT0 takes a period of time, the delay circuit 160 may apply a predetermined delay to the control clock CLK0 to generate the delayed control clock CLK0D.

As shown in FIG. 1, the duty cycle adjustment circuit 110 comprises an input stage circuit 112 and a buffer 113, where an input terminal of the buffer 113 is coupled to an output terminal of the input stage circuit 112. In this embodiment, the duty cycle adjustment circuit 110 further comprises an inverter 111 and an adjustable capacitor CL, where the inverter 111 is coupled to an input terminal of the input stage circuit 112, and the adjustable capacitor CL is coupled to an output terminal of the input stage circuit 112. In this embodiment, the inverter 111 receives the input clock CLKIN and accordingly generates an inverted clock of the input clock CLKIN to the input terminal of the input stage circuit 112. In some embodiments, the inverter 111 may be replaced with a buffering circuit comprising an even number of inverters, in order to transmit the input clock CLKIN to the input terminal of the input stage circuit 112, but the present invention is not limited thereto.

In this embodiment, the input stage circuit 112 generates an intermediate signal at an intermediate node (e.g. the adjustable capacitor CL) according to the input clock CLKIN, where the input stage circuit 112 comprises multiple switch circuits such as multiple N-type transistors Msn and multiple P-type transistors Msp. Turning on of any of the multiple switch circuits is controlled by a corresponding bit of the digital control code DCT1, in order to determine a rise time or a fall time of the intermediate signal. In addition, the buffer 113 generates the output clock CLKOUT according to the intermediate signal, where the duty cycle of the output clock CLKOUT may be controlled according to the rise time or the fall time of the intermediate signal. In this embodiment, the input stage circuit 112 further comprises an N-type transistor MN and a P-type transistor MP, where gate terminals of the N-type transistor MN and the P-type transistor MP are configured to receive the inverted clock of the input clock CLKIN. In some embodiments, the gate terminals of the N-type transistor MN and the P-type transistor MP are configured to receive the input clock CLKIN (e.g. receiving the input clock CLKIN through the buffering circuit comprising the even number of inverters), but the present invention is not limited thereto.

In detail, the multiple N-type transistors Msn may be respectively coupled to multiple resistors RN in series, and further coupled between the N-type transistor MN and the intermediate node. The multiple P-type transistors Msp may be respectively coupled to multiple resistors RP in series, and further coupled between the P-type transistor MP and the intermediate node. Gate terminals of the multiple N-type transistors Msn may be controlled by multiple bits of the digital control code DCT1, respectively, and gate terminals of the multiple P-type transistors Msp may be controlled by the multiple bits of the digital control code DCT1, respectively. When the input clock CLKIN switches to the logic value "1" from the logic value "0", the inverted clock of the input clock CLKIN switches to the logic value "0" from the logic value "1", turning off the N-type transistor MN and turning on the P-type transistor MP, where the digital control code DCT1 may control an on/off state of each of the multiple P-type transistors Msp to control a magnitude of a pull-up current for determining the rise time of the intermediate signal. When the input clock CLKIN switches to the logic value "0" from the logic value "1", the inverted clock of the input clock CLKIN switches to the logic value "1" from the logic value "0", turning on the N-type transistor MN and turning off the P-type transistor MP, where the digital control code DCT1 may control an on/off state of each of the multiple N-type transistors Msn to control a magnitude of a pull-down current for determining the fall time of the intermediate signal.

In this embodiment, resistances of the resistors RN and the resistors RP and a capacitance of the adjustable capacitor CL may be determined according to a required time constant, to ensure that a value (e.g. a change thereof) of the digital control code DCT1 is able to effectively adjust the duty cycle of the output clock CLKOUT. In some embodiments, the resistors RN and RP may be omitted, and the required time constant may be obtained through parasitic resistors existing in circuit wiring, but the present invention is not limited thereto.

It should be noted that, even though the embodiment of FIG. 1 utilizes the digital control code DCT1 to control the rise time and the fall time of the intermediate signal together, the present invention is not limited thereto. In some embodiments, the digital control code DCT1 may be arranged for controlling the rise time of the intermediate signal only, e.g. arranged for controlling the gate terminals of the multiple P-type transistors Msp only, where the multiple N-type transistors Msn may be controlled by other digital code(s) such as an adjustable or fixed digital control code, or the multiple N-type transistors Msn and the multiple resistors RN may be implemented with (e.g. replaced with) fixed current paths without any switching mechanism, but the present invention is not limited thereto. In some embodiments, the digital control code DCT1 may be arranged for controlling the fall time of the intermediate signal only, e.g. arranged for controlling the gate terminals of the multiple N-type transistors Msn only, where the multiple P-type transistors Msp may be controlled by other digital code(s) such as an adjustable or fixed digital control code, or the multiple P-type transistors Msp and the multiple resistors RP may be implemented with (e.g. replaced with) fixed current paths without any switching mechanism, but the present invention is not limited thereto.

In addition, even though the embodiment of the present invention controls the multiple switch circuits mentioned above with a binary digital control code, the present invention is not limited thereto. In some embodiments, the all-digital duty cycle corrector 10 may further comprise a binary-to-thermometer decoder to convert the digital control code DCT1 into a thermometer code for controlling the multiple switch circuits mentioned above. Regarding this implementation, those skilled in the art should understand how to implement the corresponding architecture of the input stage circuit 112 (e.g. the number of switch circuits, the number of resistors RN and RP, and the resistances of the resistors RN and RP) according to the descriptions of above paragraphs, and related details are omitted here for brevity.

In addition, the asynchronous sampler 120 may comprise a digital sampler such as a D-type flip-flop (DFF) 121, an oscillator 122 such as a free-running oscillator which is out of control of the output clock CLKOUT, and a reset pulse generator 125, where the reset pulse generator 125 may comprise a delay circuit 123 (labeled "Delay" in FIG. 1 for brevity) and an AND logic gate 124 (labeled "AND" in FIG. 1 for brevity). In this embodiment, the oscillator 122 may provide an asynchronous clock CLKOSC, and the reset pulse generator 125 may generate a reset pulse RST according to the asynchronous clock CLKOSC and a delayed clock CLKOSCD of the asynchronous clock CLKOSC. For example, the delay circuit 123 may apply a predetermined delay to the asynchronous clock CLKOSC for generating the delayed clock CLKOSCD, and the AND logic gate 124 may perform an AND logic operation on the asynchronous clock CLKOSC and the delayed clock CLKOSCD to generate the reset pulse RST. In addition, the DFF 121 may sample the output clock CLKOUT according to timing of the asynchronous clock CLKOSC, where the DFF 121 may be reset according to timing of the reset pulse RST. In some embodiments, the digital sampler may be implemented with a digital sampling circuit which has a setup time and a hold time less than that of the DFF 121, to ensure a sampling error for the output clock CLKOUT with a high frequency is small enough, but the present invention is not limited thereto. In addition, the oscillator 122 may be replaced with an all-digital phase-locked loop to provide a stable asynchronous clock, and such alternative design does not affect the digitalization of an overall system (e.g. the overall system is still an all-digital architecture).

Figure 2:
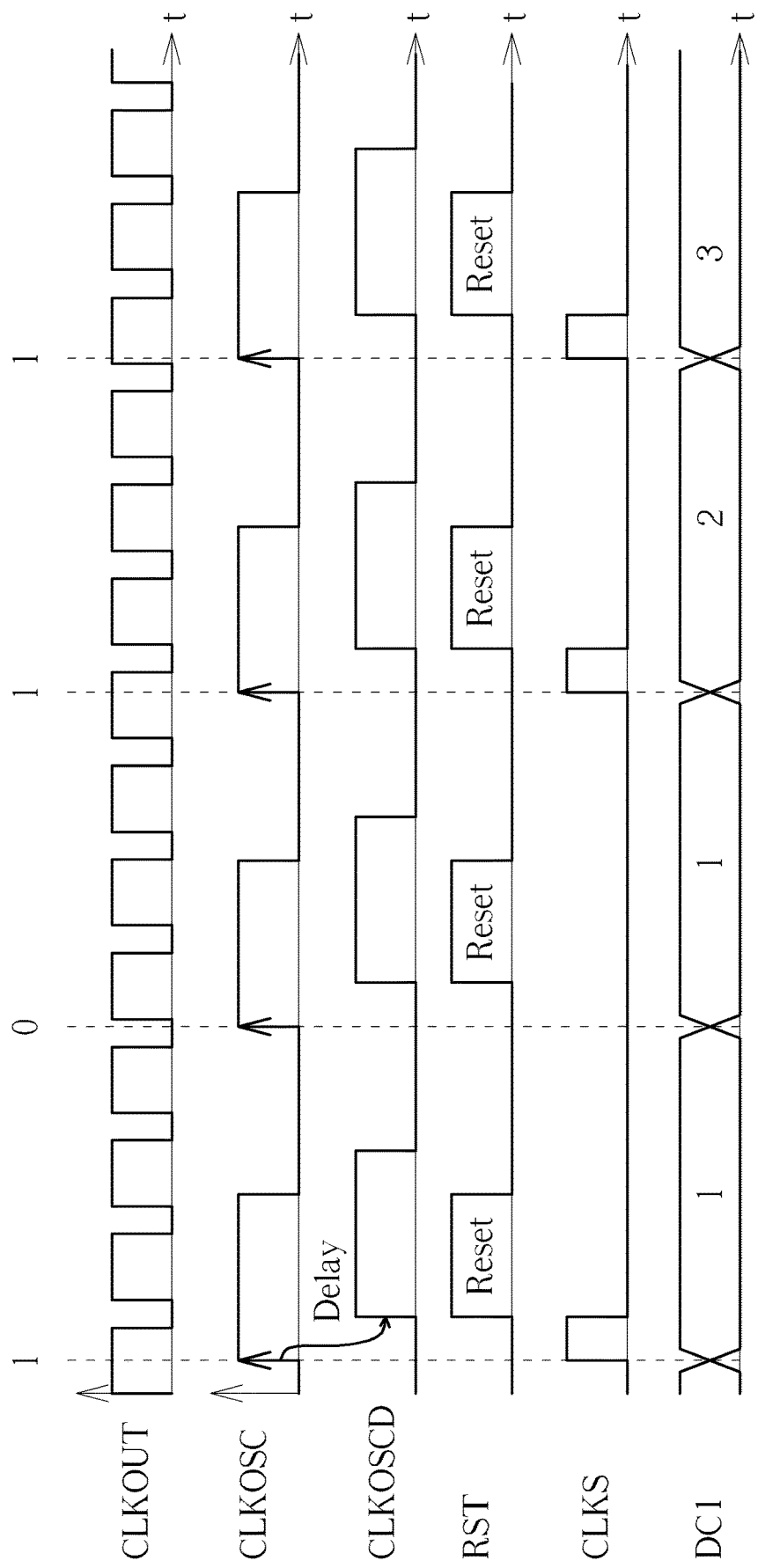
FIG. 2 is a diagram illustrating associated signals of an asynchronous sampler and a counter according to an embodiment of the present invention.

For better comprehension, please refer to FIG. 2, which is a diagram illustrating associated signals of the asynchronous sampler 120 and the counter 130 such as the output clock CLKOUT, the asynchronous clock CLKOSC, the delayed clock CLKOSCD, the reset pulse RST, the sampled clock CLKS and the counting result DC1 according to an embodiment of the present invention, where a horizontal axis of each signal represents time, which is labeled "t" in FIG. 2 for brevity.

As shown in FIG. 2, at a first rising edge of the asynchronous clock CLKOSC, the DFF 121 may perform first sampling on the output clock CLKOUT, where a logic value of the output clock CLKOUT at the first rising edge of the asynchronous clock CLKOSC is "1". Thus, a logic value of the sampled clock CLKS is pulled up to "1" from "0", and the counting result DC1 generated by the counter 130 is increased to "1" from "0" at this moment (which means a total number of logic values "1" obtained by the sampling is "1" at this moment). Then, the DFF 121 is reset in response to a first rising edge of the reset pulse RST, and the logic value of the sampled clock CLKS is pulled down to "0" from 1. At a second rising edge of the asynchronous clock CLKOSC, the DFF 121 may perform second sampling on the output clock CLKOUT, where the logic value of the output clock CLKOUT at the second rising edge of the asynchronous clock CLKOSC is "0". Thus, the logic value of the sampled clock CLKS is maintained at "0", and the counting result DC1 generated by the counter 130 is maintained at "1" at this moment (which means the total number of logic values "1" obtained by the sampling is "1" at this moment). Then, the DFF 121 is reset in response to a second rising edge of the reset pulse RST, and the logic value of the sampled clock CLKS is maintained at "0". At a third rising edge of the asynchronous clock CLKOSC, the DFF 121 may perform third sampling on the output clock CLKOUT, where the logic value of the output clock CLKOUT at the third rising edge of the asynchronous clock CLKOSC is "1". Thus, the logic value of the sampled clock CLKS is pulled up to "1" from "0", and the counting result DC1 generated by the counter 130 is increased to "2" from "1" at this moment (which means the total number of logic values "1" obtained by the sampling is "2" at this moment). Then, the DFF 121 is reset in response to a third rising edge of the reset pulse RST, and the logic value of the sampled clock CLKS is pulled down to "0" from "1". At a fourth rising edge of the asynchronous clock CLKOSC, the DFF 121 may perform fourth sampling on the output clock CLKOUT, where the logic value of the output clock CLKOUT at the fourth rising edge of the asynchronous clock CLKOSC is "1". Thus, the logic value of the sampled clock CLKS is pulled up to "1"

from "0", and the counting result DC1 generated by the counter 130 is increased to "3" from "2" at this moment (which means the total number of logic values "1" obtained by the sampling is "3" at this moment). Then, the DFF 121 is reset in response to a fourth rising edge of the reset pulse RST, and the logic value of the sampled clock CLKS is pulled down to "0" from "1". Subsequent operations of asynchronous sampling and operations of counting the number of logic values "1" may be deduced by analogy, and related details are omitted here for brevity.

It should be noted that, in order to ensure that the counting result DC1 can properly reflect the status of the duty cycle of the output clock CLKOUT, randomness is required in the operation of the asynchronous sampler 120 sampling the output clock CLKOUT. In detail, a frequency of the asynchronous clock CLKOSC may be lower than a frequency of the output clock CLKOUT. A cycle period Tasync of the asynchronous clock CLKOSC is non-integer times a cycle period Tout of the output clock CLKOUT. For example, a relationship of the cycle period Tasync of the asynchronous clock CLKOSC and the cycle period Tout of the output clock CLKOUT may be expressed as Tasync=(M+α)×Tout, where M is a positive integer, and α is a non-zero fractional number. In some embodiments, the frequency of the asynchronous clock CLKOSC may be increased in order to shorten a time period of adjusting the digital control codes DCT0 and DCT1 each time.

In addition, the correction control circuit 180 may further comprise a subtracter 181, an OR logic gate 182 (labeled "OR" in FIG. 1 for brevity), a control logic such as a finite state machine (FSM) 183, and an adder 184, where the subtracter 181, the FSM 183 and the adder 184 operate according to timing of the control clock CLK0, as shown by dashed arrows. In this embodiment, the subtracter 181 may perform subtraction on the counting result DREG and the reference value DREF to generate the comparison result, where the comparison result may be represented by a two's complement, and more particularly, the two's complement of the comparison result may comprise a subtraction value DSUB (e.g. a subtraction value represented by a 6-bit digital signal) and a sign bit DSIGN. In this embodiment, the OR logic gate 182 may perform an OR logic operation on all bits of the subtraction value DSUB to generate a value bit DS, where the value bit DS may indicate whether all bits of the subtraction value DSUB are "1". Under a condition where both the counting result DREG and the reference value DREF are 6-bit digital signals, it is assumed that the reference value DREF is 32. When {DSIGN, DS} is {0, 1}, it means a subtraction result of the counting result DREG and the reference value DREF is positive, and the FSM 182 may accordingly determine that the duty cycle of the output clock CLKOUT at this moment is greater than 50%. When {DSIGN, DS} is {0, 0}, it means the subtraction result of the counting result DREG and the reference value DREF is zero, and the FSM 182 may accordingly determine that the duty cycle of the output clock CLKOUT at this moment is equal to 50%. When {DSIGN, DS} is {1, 0} or {1, 1}, it means the subtraction result of the counting result DREG and the reference value DREF is negative, and the FSM 182 may accordingly determine that the duty cycle of the output clock CLKOUT at this moment is less than 50%. Thus, the FSM 182 may determine an adjustment code DRES according to the comparison result (e.g. the sign bit DSIGN and the value bit DS) and a present value of the digital control code DCT0 (e.g. a value of the digital control code DCT0 at a present cycle of the control clock CLK0), and the adder 184 may add the present value of the digital control code DCT0 and the adjustment value DRES to generate a new value of the digital control code DCT0 (e.g. a value of the digital control code DCT0 at a next cycle of the control clock CLK0).

TABLE 1

| DSIGN | DS | DCT0 (6-bit) | DRES | Two's complement of DRES (7-bit) |
|---|---|---|---|---|
| 0 | 0 | 000000 | +0 | 0000000 |
| 0 | 1 | 000000 | +1 | 0000001 |
| 1 | 0 | 000000 | +0 | 0000000 |
| 1 | 1 | 000000 | +0 | 0000000 |
| 0 | 0 | 000001~111110 | +0 | 0000000 |
| 0 | 1 | 000001~111110 | +1 | 0000001 |
| 1 | 0 | 000001~111110 | −1 | 1111111 |
| 1 | 1 | 000001~111110 | −1 | 1111111 |
| 0 | 0 | 111111 | +0 | 0000000 |
| 0 | 1 | 111111 | +0 | 0000000 |
| 1 | 0 | 111111 | −1 | 1111111 |
| 1 | 1 | 111111 | −1 | 1111111 |

Table 1 is a truth table corresponding to the operation of the FSM 182 (e.g. generating the adjustment code DRES according to the sign bit DSIGN, the value bit DS and the digital control code DCT0). When the comparison result indicates that the counting result DREG is equal to the reference value DREF (e.g. {DSIGN, DS} is {0, 0}), regardless of the value of the digital control code DCT0, the adjustment code DREF output from the FSM 182 is "+0" (e.g. "0000000" in two's complement), as shown in a 2 nd row, a 6th row and a 10th row of Table 1. When the comparison result indicates that the counting result DREG is greater than the reference value DREF (e.g. {DSIGN, DS} is {0, 1}) and the digital control code DCT0 does not reach a maximum allowable value (e.g. the digital control code DCT0 falls in a range from 000000 to 111110), the adjustment code DRES output from the FSM 182 is "+1" (e.g. "0000001" in two's complement), as shown in a 3rd row and a 7th row of Table 1. Thus, by operations of the adder 184, the correction control circuit 180 may increase the digital control codes DCT0 and DCT1 to make the duty cycle adjustment circuit 110 reduce the duty cycle of the output clock CLKOUT. When the comparison result indicates that the counting result DREG is less than the reference value DREF (e.g. {DSIGN, DS} is {1, 0} or {1, 1}) and the digital control code DCT0 does not reach a minimum allowable value (e.g. the digital control code DCT0 falls in a range from 000001 to 111111), the adjustment code DRES output from the FSM 183 is "−1" (e.g. "1111111" in two's complement), as shown in an 8th row, a 9th row, a 12th row and a 13th row. Thus, by operations of the adder 184, the correction control circuit 180 may reduce the digital control codes DCT0 and DCT1, to make the duty cycle adjustment circuit 110 increase the duty cycle of the output clock CLKOUT.

In addition, the maximum allowable value and the minimum allowable value of a 6-bit digital signal are 111111 and 000000, respectively. The FSM 183 may properly control the adjustment code DRES in response to a condition of the digital control code reaching the maximum allowable value or the minimum allowable value, in order to prevent circuits from being unstable due to occurrence of overflow errors or underflow errors. For example, when the comparison result indicates that the counting result DREG is less than the reference value DREF (e.g. {DSIGN, DS} is {1, 0} or {1, 1}) and the digital control code DCT0 reaches the minimum allowable value (e.g. the digital control code DCT0 is "000000"), the adjustment code DRES output from the FSM 182 is "+0" (e.g. "0000000" in two's complement), as shown in a 4th row and a 5th row of Table 1. Thus, the correction control circuit 180 may maintain the digital control codes DCT0 and DCT1, to make the duty cycle adjustment circuit 110 maintain the duty cycle of the output clock CLKOUT. When the comparison result indicates that the counting result DREG is greater than the reference value DREF (e.g. {DSIGN, DS} is {0, 1}) and the digital control code DCT0 reaches the maximum allowable value (e.g. the digital control code DCT0 is "111111"), the adjustment code DRES output from the FSM 183 is "+0" (e.g. "0000000" in two's complement), as shown in an 11th row of Table 1. Thus, the correction control circuit 180 may maintain the digital control codes DCT0 and DCT1, to make the duty cycle adjustment circuit 110 maintain the duty cycle of the output clock CLKOUT.

It should be noted that implementation of the all-digital duty cycle corrector 10 is based on utilizing the digital control code DCT1 in 6 bits for adjusting the duty cycle of the output clock CLKOUT. If requirements of the adjustment precision of the duty cycle are lowered, a bit count of an overall system can be accordingly reduced in order to save circuit area.

Figure 3:
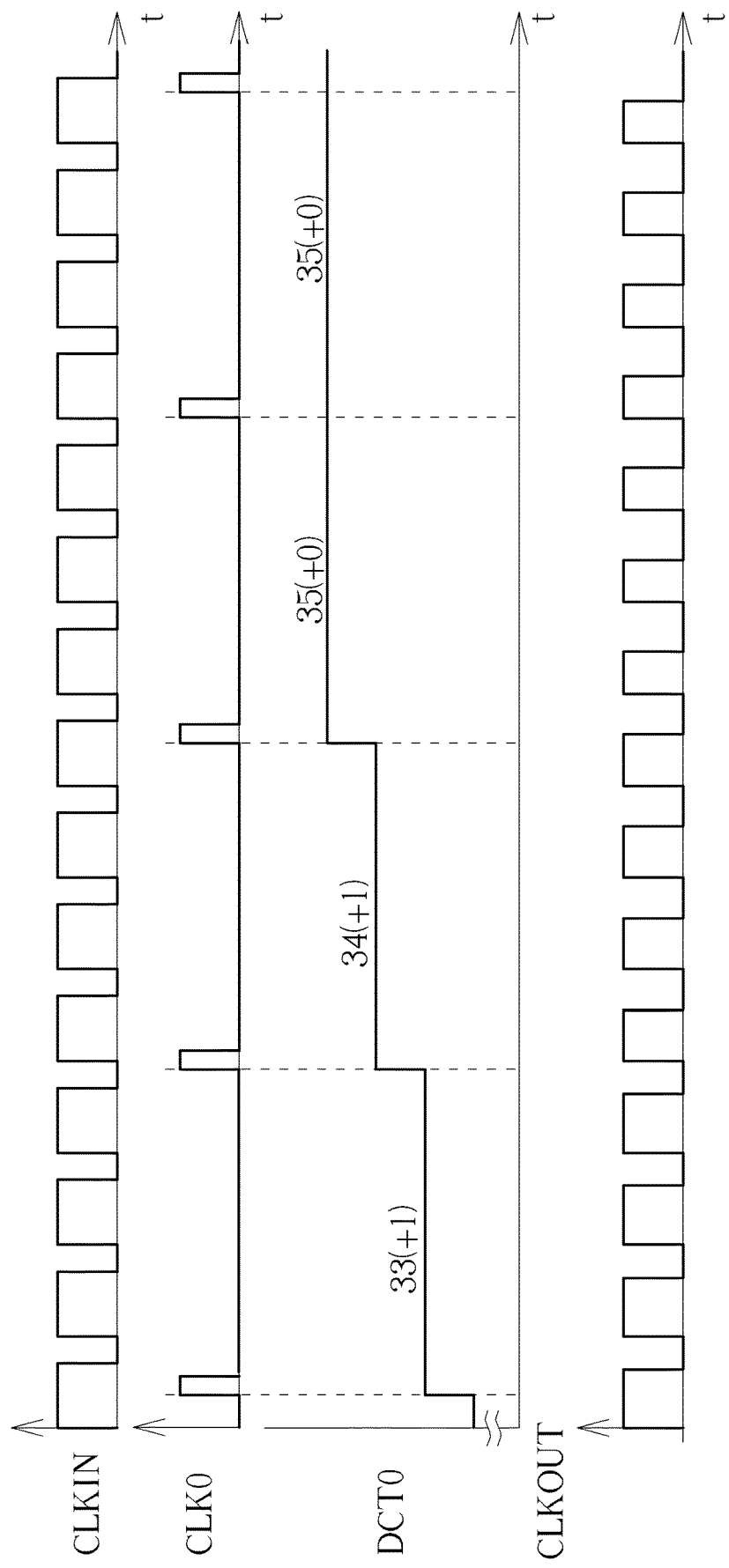
FIG. 3 is a diagram illustrating a duty cycle of an output clock which is gradually corrected to 50% according to an embodiment of the present invention.

FIG. 3 is a diagram illustrating the duty cycle of the output clock CLKOUT which is gradually corrected to 50% according to an embodiment of the present invention, where a horizontal axis of each signal (e.g. the input clock CLKIN, the control clock CLK0, the digital control code DCT0 and the output clock CLKOUT) shown in FIG. 3 represents time, which is labeled "t" in FIG. 3 for brevity. As shown in FIG. 3, when the digital control code DCT1 is "33", the duty cycle of the output clock CLKOUT is greater than 50%. Thus, the adjustment code DRES output from the FSM 183 is "+1" (labeled "33(+1)" in FIG. 3 for better comprehension) to make the digital control code DCT0 be increased to 34 at a rising edge of the control clock CLK0, thereby reducing the duty cycle of the output clock CLKOUT. When the digital control code DCT1 is "34", the duty cycle of the output clock CLKOUT is still greater than 50%. Thus, the adjustment code DRES output from the FSM 183 is "+1" (labeled "34(+1)" in FIG. 3 for better comprehension) to make the digital control code DCT0 be increased to 35 at a rising edge of the control clock CLK0. When the digital control code DCT1 is "35", the duty cycle of the output clock is equal to 50%. Thus, the adjustment code DRES output from the FSM 183 is "+0" (labeled "35(+0)" in FIG. 3 for better comprehension) to make the digital control code DCT0 maintained at 35, and the correction of the duty cycle of the output clock CLKOUT is completed.

Figure 4:
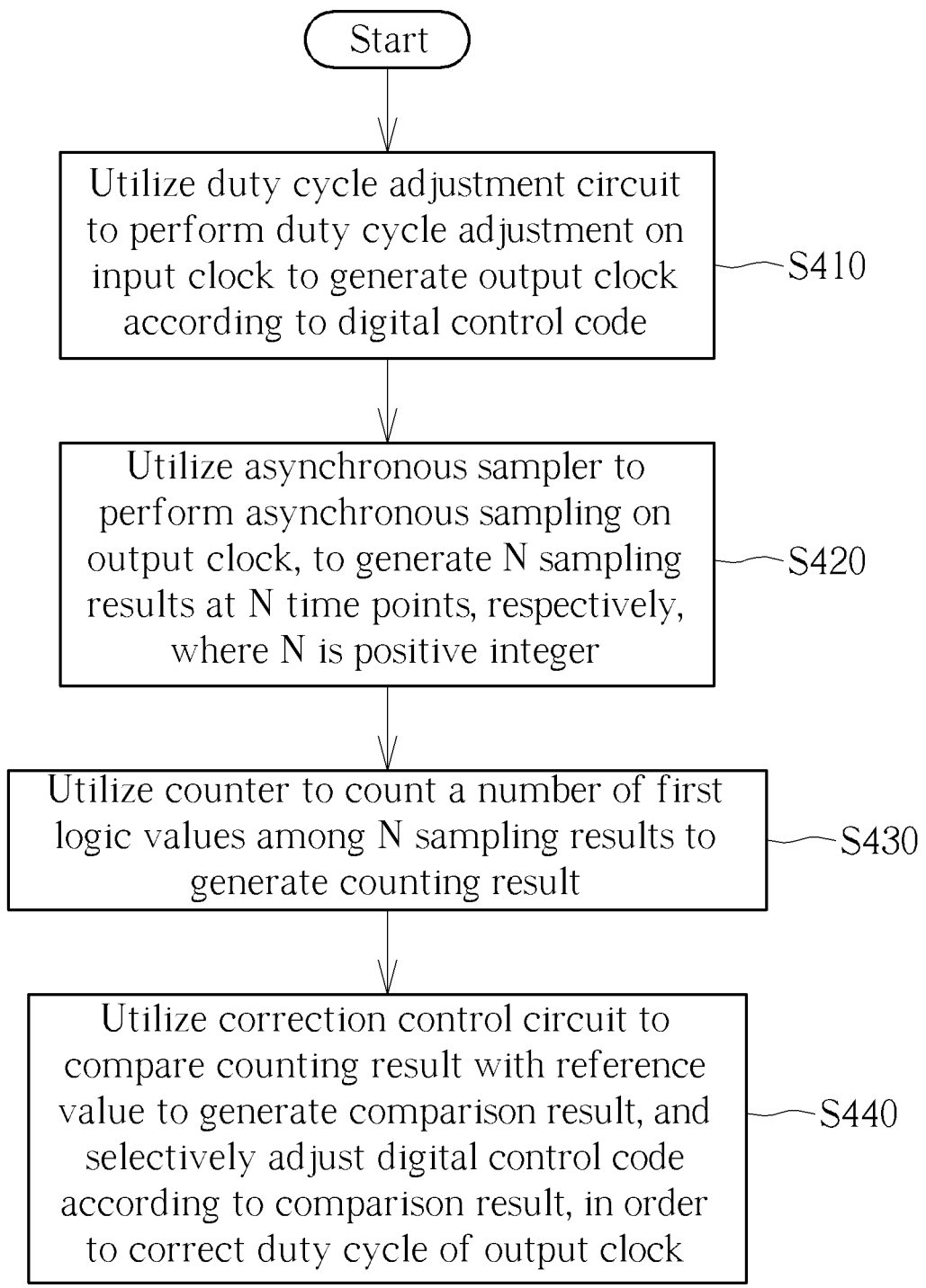
FIG. 4 is a diagram illustrating a working flow of a method for correcting a duty cycle of an output clock according to an embodiment of the present invention.

FIG. 4 is a diagram illustrating a working flow of a method for correcting a duty cycle of an output clock according to an embodiment of the present invention, where the method is applicable to an all-digital duty cycle corrector such as the all-digital duty cycle corrector 10 shown in FIG. 1. It should be noted that one or more steps may be added, deleted or modified in the working flow shown in FIG. 4. In addition, if an overall result is not affected, these steps do not have to be executed in the exact order shown in FIG. 4.

In Step S410, the all-digital duty cycle corrector may utilize a duty cycle adjustment circuit therein to perform duty cycle adjustment on an input clock to generate the output clock according to a digital control code.

In Step S420, the all-digital duty cycle corrector may utilize an asynchronous sampler therein to perform asynchronous sampling on the output clock, to generate N sampling results at N time points, respectively, where N is a positive integer.

In Step S430, the all-digital duty cycle corrector may utilize a counter therein to count a number of first logic values among the N sampling results to generate a counting result.

In Step S440, the all-digital duty cycle corrector may utilize a correction control circuit therein to compare the counting result with a reference value to generate a comparison result, and selectively adjust the digital control code according to the comparison result, in order to correct the duty cycle of the output clock.

To summarize, the all-digital duty cycle corrector and the associated method provided by the embodiments of the present invention implement duty cycle correction control using digital signals. Thus, the overall system can be implemented with an all-digital architecture. As analog circuits such as operational amplifiers are not utilized, the embodiments of the present invention can allow the all-digital duty cycle corrector performance to continue improving along with the development of semiconductor processes.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An all-digital duty cycle corrector, comprising:
   a duty cycle adjustment circuit, configured to perform duty cycle adjustment on an input clock to generate an output clock according to a digital control code;
   an asynchronous sampler, configured to perform asynchronous sampling on the output clock to generate N sampling results at N time points, respectively, wherein N is a positive integer;
   a counter, configured to count a number of first logic values among the N sampling results to generate a counting result; and
   a correction control circuit, configured to compare the counting result with a reference value to generate a comparison result, and selectively adjust the digital control code according to the comparison result, in order to correct a duty cycle of the output clock;
   wherein the asynchronous sampler comprises:
   an oscillator, configured to provide an asynchronous clock;
   a reset pulse generator, configured to generate a reset pulse according to the asynchronous clock and a delayed pulse of the asynchronous clock; and
   a digital sampler, configured to sample the output clock according to timing of the asynchronous clock, wherein the digital sampler is reset according to timing of the reset pulse.

2. The all-digital duty cycle corrector of claim 1, wherein the duty cycle adjustment circuit comprises:
   an input stage circuit, configured to generate an intermediate signal at an intermediate node according to the input clock, wherein the input stage circuit comprises multiple switch circuits, and turning on of any of the multiple switch circuits is controlled by a corresponding bit of the digital control code, in order to determine a rise time or a fall time of the intermediate signal; and
   a buffer, configured to generate the output clock according to the intermediate signal, wherein the duty cycle of the output clock is controlled according to the rise time or the fall time of the intermediate signal.

3. The all-digital duty cycle corrector of claim 2, wherein the input stage circuit further comprises:

an N-type transistor and a P-type transistor, configured to receive the input clock or an inverted clock of the input clock, wherein the multiple switch circuits are coupled between the N-type transistor and the intermediate node or coupled between the P-type transistor and the intermediate node.

4. The all-digital duty cycle corrector of claim 1, wherein the correction control circuit comprises:
a subtracter, configured to perform subtraction on the counting result and the reference value to generate the comparison result;
a control logic, configured to determine an adjustment code according to the comparison result and a present value of the digital control code; and
an adder, configured to add the present value of the digital control code and the adjustment code to generate a new value of the digital control code.

5. The all-digital duty cycle corrector of claim 1, wherein when the comparison result indicates that the counting result is greater than the reference value and the digital control code does not reach a maximum allowable value, the correction control circuit increases the digital control code to make the duty cycle adjustment circuit reduce the duty cycle of the output clock.

6. The all-digital duty cycle corrector of claim 1, wherein when the comparison result indicates that the counting result is greater than the reference value and the digital control code reaches a maximum allowable value, the correction control circuit maintains the digital control code to make the duty cycle adjustment circuit maintain the duty cycle of the output clock.

7. The all-digital duty cycle corrector of claim 1, wherein when the comparison result indicates that the counting result is less than the reference value and the digital control code does not reach a minimum allowable value, the correction control circuit reduces the digital control code to make the duty cycle adjustment circuit increase the duty cycle of the output clock.

8. The all-digital duty cycle corrector of claim 1, wherein when the comparison result indicates that the counting result is less than the reference value and the digital control code reaches a minimum allowable value, the correction control circuit maintains the digital control code to make the duty cycle adjustment circuit maintain the duty cycle of the output clock.

9. A method for correcting a duty cycle of an output clock, wherein the method is applicable to an all-digital duty cycle corrector, and the method comprises:
utilizing a duty cycle adjustment circuit of the all-digital duty cycle corrector to perform duty cycle adjustment on an input clock to generate the output clock according to a digital control code;
utilizing an asynchronous sampler of the all-digital duty cycle corrector to perform asynchronous sampling on the output clock to generate N sampling results at N time points, respectively, wherein N is a positive integer;
utilizing a counter of the all-digital duty cycle corrector to count a number of first logic values among the N sampling results to generate a counting result; and
utilizing a correction control circuit of the all-digital duty cycle corrector to compare the counting result with a reference value to generate a comparison result, and selectively adjust the digital control code according to the comparison result, in order to correct the duty cycle of the output clock;
wherein utilizing the asynchronous sampler of the all-digital duty cycle corrector to perform the asynchronous sampling on the output clock to generate the N sampling results at the N time points respectively comprises:
utilizing an oscillator of the asynchronous sampler to provide an asynchronous clock;
utilizing a reset pulse generator of the asynchronous sampler to generate a reset pulse according to the asynchronous clock and a delayed pulse of the asynchronous clock; and
utilizing a digital sampler of the asynchronous sampler to sample the output clock according to timing of the asynchronous clock, wherein the digital sampler is reset according to timing of the reset pulse.

10. The method of claim 9, wherein utilizing the duty cycle adjustment circuit of the all-digital duty cycle corrector to perform the duty cycle adjustment on the input clock to generate the output clock according to the digital control code comprises:
utilizing an input stage circuit of the duty cycle adjustment circuit to generate an intermediate signal at an intermediate node according to the input clock, wherein the input stage circuit comprises multiple switch circuits, and turning on of any of the multiple switch circuits is controlled by a corresponding bit of the digital control code, in order to determine a rise time or a fall time of the intermediate signal; and
utilizing a buffer of the duty cycle adjustment circuit to generate the output clock according to the intermediate signal, wherein the duty cycle of the output clock is controlled according to the rise time or the fall time of the intermediate signal.

11. The method of claim 10, wherein utilizing the input stage circuit of the duty cycle adjustment circuit to generate the intermediate signal at the intermediate node according to the input clock comprises:
utilizing an N-type transistor and a P-type transistor of the input stage circuit to receive the input clock or an inverted clock of the input clock, wherein the multiple switch circuits are coupled between the N-type transistor and the intermediate node or coupled between the P-type transistor and the intermediate node.

12. The method of claim 9, wherein utilizing the correction control circuit of the all-digital duty cycle corrector to compare the counting result with the reference value to generate the comparison result and selectively adjust the digital control code according to the comparison result in order to correct the duty cycle of the output clock comprises:
utilizing a subtracter of the correction control circuit to perform subtraction on the counting result and the reference value to generate the comparison result;
utilizing a control logic of the correction control circuit to determine an adjustment code according to the comparison result and a present value of the digital control code; and
utilizing an adder of the correction control circuit to add the present value of the digital control code and the adjustment code to generate a new value of the digital control code.

13. The method of claim 9, wherein utilizing the correction control circuit of the all-digital duty cycle corrector to compare the counting result with the reference value to generate the comparison result and selectively adjust the digital control code according to the comparison result in order to correct the duty cycle of the output clock comprises:

in response to the comparison result indicating that the counting result is greater than the reference value and the digital control code does not reach a maximum allowable value, utilizing the correction control circuit to increase the digital control code to make the duty cycle adjustment circuit reduce the duty cycle of the output clock.

14. The method of claim 9, wherein utilizing the correction control circuit of the all-digital duty cycle corrector to compare the counting result with the reference value to generate the comparison result and selectively adjust the digital control code according to the comparison result in order to correct the duty cycle of the output clock comprises:
   in response to the comparison result indicating that the counting result is greater than the reference value and the digital control code reaches a maximum allowable value, utilizing the correction control circuit to maintain the digital control code to make the duty cycle adjustment circuit maintain the duty cycle of the output clock.

15. The method of claim 9, wherein utilizing the correction control circuit of the all-digital duty cycle corrector to compare the counting result with the reference value to generate the comparison result and selectively adjust the digital control code according to the comparison result in order to correct the duty cycle of the output clock comprises:
   in response to the comparison result indicating that the counting result is less than the reference value and the digital control code does not reach a minimum allowable value, utilizing the correction control circuit to reduce the digital control code to make the duty cycle adjustment circuit increase the duty cycle of the output clock.

16. The method of claim 9, wherein utilizing the correction control circuit of the all-digital duty cycle corrector to compare the counting result with the reference value to generate the comparison result and selectively adjust the digital control code according to the comparison result in order to correct the duty cycle of the output clock comprises:
   in response to the comparison result indicating that the counting result is less than the reference value and the digital control code reaches a minimum allowable value, utilizing the correction control circuit to maintain the digital control code to make the duty cycle adjustment circuit maintain the duty cycle of the output clock.

* * * * *